United States Patent [19]
Burrows

[11] Patent Number: 6,005,503
[45] Date of Patent: Dec. 21, 1999

[54] METHOD FOR ENCODING AND DECODING A LIST OF VARIABLE SIZE INTEGERS TO REDUCE BRANCH MISPREDICTS

[75] Inventor: Michael Burrows, Palo Alto, Calif.

[73] Assignee: Digital Equipment Corporation, Maynard, Mass.

[21] Appl. No.: 09/031,882

[22] Filed: Feb. 27, 1998

[51] Int. Cl.[6] .................................................. H03M 7/40
[52] U.S. Cl. .......................................................... 341/67
[58] Field of Search .................................. 341/67, 76, 87, 341/77

[56] References Cited

U.S. PATENT DOCUMENTS

| | | | |
|---|---|---|---|
| 4,719,642 | 1/1988 | Lucas | 375/30 |
| 5,467,134 | 11/1995 | Laney et al. | 348/409 |
| 5,724,033 | 3/1998 | Burrows . | |

*Primary Examiner*—Brian Young
*Attorney, Agent, or Firm*—Fenwick & West LLP

[57] ABSTRACT

In a computer implemented method, a list of variable size integers is encoded in a memory. Each variable size integer is expressed as a set of a minimum number of bytes. A fixed number the bytes of the sets are grouped with an associated bit map into a logical memory word unit. Each bit map has one continuation bit for each of the fixed number of bytes. Each continuation bit indicating whether or not a particular variable size integer continues into a following byte. An entry is stored in an array for each possible pattern of continuation bits of the bit maps. Each entry including a plurality of fields. There is one field for each of the fixed number of bytes in each group. Each field stories a length of a corresponding set of bytes expressing a particular variable size integer in the group. The entries provide a decoding table that is indexable by the bit maps to recover the list of variable size integers.

11 Claims, 6 Drawing Sheets

METHOD FOR ENCODING AND DECODING A LIST OF VARIABLE SIZE INTEGERS TO REDUCE BRANCH MISPREDICTS

FIELD OF THE INVENTION

This invention relates generally to encoding a list of variable size integers, and more particularly to decrease the number of branch mispredicts while during decoding the encoded list of integers.

BACKGROUND OF THE INVENTION

In U.S. patent application Ser. No. 08/695,059 filed by Burrows on Aug. 9, 1996 a method for encoding delta values is described. Delta encoding is a way to compress an ordered sequence of integers. Each delta value is the difference between a current integer and a previous integer in the sequence. Subsequently, any integer in the sequence can be recovered by sequentially adding the delta values to each other. As disclosed by Burrows, the integers are encoded as delta values as follows.

First, each delta value is written in a binary form. The binary form of each delta value is then partitioned into groups of seven bits, padding up to a multiple of seven bits when necessary. The number of groups required depends on the size of the delta value. If the integers in the sequence are relatively close together, then most delta values can be expressed in two groups. Only occasionally are one group or more than two groups of seven bits required.

After grouping, an additional "continuation" bit is added to each group of seven bits to form eight bit bytes. The continuation bit is set to one when the delta value continues into the next byte, and zero when the byte stores the last group of bits of the delta value. The continuation bit is set as either the high-order bit or the low-order bit for reasons described below. The list of thus encoded bytes can be stored as a file in a memory of a computer system.

Burrows describes one application where his method for delta encoding can be used. On the Internet, the World Wide Web is used to exchange information as Web pages. A Web page is composed as a sequence of tokens or "words." Words are set of characters separated by some type of separator character, for example, a space character. In Web pages, the words can be any arbitrary set of characters.

An index to the words of the Web pages can be built in a search engine, such as Digital Equipment Corporation's AltaVista search engine. The collection of pages to be indexed can be acquired by a Web "spider." As the Web pages are collected, integers are sequentially assigned to each word of all of the collected Web pages to form pairs, a word and an integer. The integers effectively are the locations or addresses of the words.

The pairs can be sorted according to the collating order of the words. The sort can be some lexicographic sort on the characters of the words. The sort results in a file having a plurality of entries, one entry for each unique word, followed by all addresses where the word appears in the Web pages. The integers representing the addresses of the word are delta encoded as described above. Each entry in the file has two components, a word field, and the list of associated delta values. No word entry appears more than once in the file.

The words are represented by a common prefix count followed by a sequence of non-zero characters that represents the suffix portion of the word. The prefix count is the number of characters of the word that are identical to a word in a previous entry. The prefix count is also an integer number that can be delta encoded as described above. The prefix count is stored as a value one greater than the actual prefix count. As a consequence, the representation of a prefix count will never be zero, and zero can be used as a terminator.

The delta values are byte packed into the file, and the end of the list of delta values is indicated by a zero byte. The next word entry, if any, begins in the following byte.

Because there are many Web pages, frequently used words, for example, "the," might occur at hundreds of millions of positions in the Web pages. By encoding the addresses as delta values, memory storage is greatly reduced.

After the index has been created, users of client computers connected to the Internet can pose queries to the index of the search engine to locate Web pages that match on the queries. An integer address of a word on any Web page is recovered as follows. The bytes are scanned sequentially according to the continuation bits of the bytes. This locates the bytes that represents a particular delta value. The continuation bits are discarded, and the groups of seven bits are reconstructed. Finally, the bits are concatenated to form the binary value that represents the next integer address of the word.

Decoding is accelerated for the following reason. As stated above, most delta values are represented by two bytes. Thus, the most common encoding consists of a byte whose continuation bit is one, followed by a byte whose continuation bit is zero. By making the continuation bit in the first byte of any delta value be the low-order bit, and the continuation bits in subsequent bytes the high-order bit, the two-byte quantity representing the integer becomes a 16-bit word whose low order bit is set to one and whose high order bit is set to zero. This is for computers that use the "little-endian" convention, which is true for most modem computers. If the decoding method reads two bytes, i.e., 16-bit words, then the recovery of the original integers can be performed more quickly. Integers whose delta values are represented by 1, 3, or more bytes take more instructions, but these should be rare.

However, there is a problem with the above described delta value decoding technique. Modem processors (CPUs) are able to issue multiple instruction during each CPU clock cycle. In addition, modem processors have an instruction pipelines that includes multiple pipeline stage, for example, a fetch stage, a map stage, an issue stage, an execution stage, and a retire stage.

As a result, many additional instructions can be fetched into the pipeline before an earlier fetched instruction completes. This tends to make modem computer systems run faster, provided that they have a linear sequence of instructions to execute. When the processor encounters a conditional branch instruction, the next instruction to be executed may be the next sequential instruction appearing after the conditional branch when the branch is not taken, or the next instruction may be some other instruction at some displaced address when the branch is taken. In the later case, the instructions that were fetched into the pipeline will be wrong. The pipeline will need to be "flushed," after which fetching can resume at the branch taken address. Resetting the pipeline consumes processor cycles and degrades performance.

In order to improve throughput, most modem processors try to predict whether a branch is going to be taken, or not. Typically, this is done using branch prediction logic. This way instructions can continued to be fetched along the predicted execution path while computing the outcome of the branch. This prediction is based on the previous behavior of the execution flow. If previous execution flows indicate that the branch is usually taken, then the fetching of the next instructions will be predicted accordingly, or vice versa.

If the logic predicts a branch correctly, then instructions continue to be executed at the normal rate. However, if a branch is mispredicted, then the processor must discard the entire state in its execution pipeline because it has started to execute instructions that must not be allowed to complete. Because several instructions may be in each pipeline stage, and the pipeline has several stages, this means that many instruction execution opportunities are wasted.

In the decoding technique described above, a conditional branch instructions must test each 16-bit word that is fetched to ensure that the low order continuation bit is a one, and its high-order continuation bit is a zero, as would be the case for most two-byte delta encoded values. If the branch is not taken, then the instructions handle the frequently occurring groups of two byte quite well. Only in the case of where the delta value is encoded in one or more than two bytes does the technique suffer from degraded performance.

Normally, the branch will not be taken because the 2-byte delta values are most common. Branch mispredictions, on the average, will occur about one-third of the time. In the preferred implementation of the above decoding, it takes exactly six instructions to recover 2-byte delta values, so one might expect to execute about 18 instructions between branch mispredictions, on the average. On very recent processors, the number of instruction execution opportunities lost on a branch mispredict can exceed 18. On such a processor, most of the time taken to decode a sequence of integers is lost in branch mispredict processing.

In general, branch mispredicts can consume half of the instruction execution opportunities in the inner loop of the procedure for scanning the list of delta values. It is the intent of the present invention to increase pipeline utilization by minimizing branch mispredicts.

SUMMARY OF THE INVENTION

Provided is a method for encoding a list of variable size integers. The encoding allows any integer in the encoded list to be recovered with a minimal number of branch mispredicts.

Each variable size integer is expressed as a minimal set of bytes. These bytes are grouped together into fixed-sized groups, to which a bitmap is added to hold continuation bits. In the preferred embodiment, bytes from one or more integers are grouped into groups of seven bytes. To each group of seven bytes an additional bitmap byte is added. Seven bits from this additional byte comprise the continuation bits for the seven bytes in this group, one bit for each byte of the group. Each continuation bit indicates whether or not a particular integer value continues into a following byte.

A memory array is constructed. The array has an entry for each possible pattern of continuation bits of the bit maps. Each entry includes a plurality of fields. There is one field for each of the fixed number of bytes in each group. Each field stores a length of a corresponding set of bytes expressing an integer value in the group to provide a decoding table indexable by the bit maps to recover the list of integers.

Each bit map can also include a termination bit. The termination bit is set to a one when the logical memory word unit stores a last integer value, otherwise the termination bit to zero.

In the fields of the array entries, the length is set to zero when there is no corresponding set of bytes expressing an integer value in the logical memory word unit. In addition, a first field of each entry stores a duplicate copy of the last non-zero length field of the entry.

The decoding of the encoded integer values is performed by storing a result value in a first register, and sequentially loading the logical memory word units into a second register. The array is indexed according to the bit map of each loaded logical memory word unit to load a corresponding entry into a third register. For each loaded word a fourth register is set to one.

Then, the following basic steps are repeated for each loaded word. The fields of the third register are shifted one field position to place the length of the corresponding set of bytes in the low-order field position of the third register. The bytes of the second register are shifted according to the value stored in the fourth register. The second register is masked according to the length of the low-order field position of the third register to extract the set of bytes of a next integer value. The length field is added to the fourth register in case the basic steps need to be repeated.

Depending on what the integer value represents, the integer value can be further manipulated, and some test can be performed to determine whether the integer value is a desired integer value. If so, the procedure completes, otherwise the basic steps are repeated in a linear execution flow until the complete logical memory word unit has been decoded.

In one application, the integer values are delta values. That is, each integer to be encoded is the difference between two adjacent integer values in an original input list. For example, the original input list is an ordered set of integers. Alternatively, the invention can be used to compress a list of integers in which each integer element in the list tends to be numerically closer to its predecessor in the list than to a mean value. In another application, the integer values represent codes for character sets, such as the ASCII or multinational character sets.

DETAILED DESCRIPTION OF THE PREFERRED EMBODIMENTS

Disclosed herein are data structures and procedures that can be used to encode and decode a list of variable size integers. In this context, the variable size refers to a minimum number of bits that are required to express each integer in the list. Because computer systems most conveniently deal with bits that are grouped in byte size quantities, the minimum number of bits required to express an integer in the list is preferably a multiple of eight. However, it will be made apparent in this disclosure that the invention can also be worked with other bit, byte or word arrangements.

In the example application used to described the preferred embodiments, the variable size integers are delta values. Delta values give the difference between adjacent integers in the list. If the integers in the list are arranged in an increasing order, than each delta value to be encoded is a positive value. Delta value encoding is also useful for compressing any list of integers where the elements in the list tend to be numerically closer to adjacent elements than to the mean value of all the integers in the list, for example, the integers represent the amplitude in a digitally encoded audio signal. In this case, the delta values can be signed integers. However, it should be understood that the invention can be used to encode and decode a list of any type of variable size integers.

For example, in digital communications, various character sets can be encoded in either one, two, or three bytes, e.g., ASCII, ISO-Latin, Unity, etc. These one, two, and three byte quantities can be viewed as variable size integers which can be encoded and decoded according to the invention.

The data structures are organized so that the encoded integers can be recovered with a minimal number of branch mispredicts. Although the present invention can be used for any type of integer encoding, it is particularly useful for encoding delta values which represent a large number of integer addresses of words of Web pages as indexed by a Web search engine.

Figure 1:
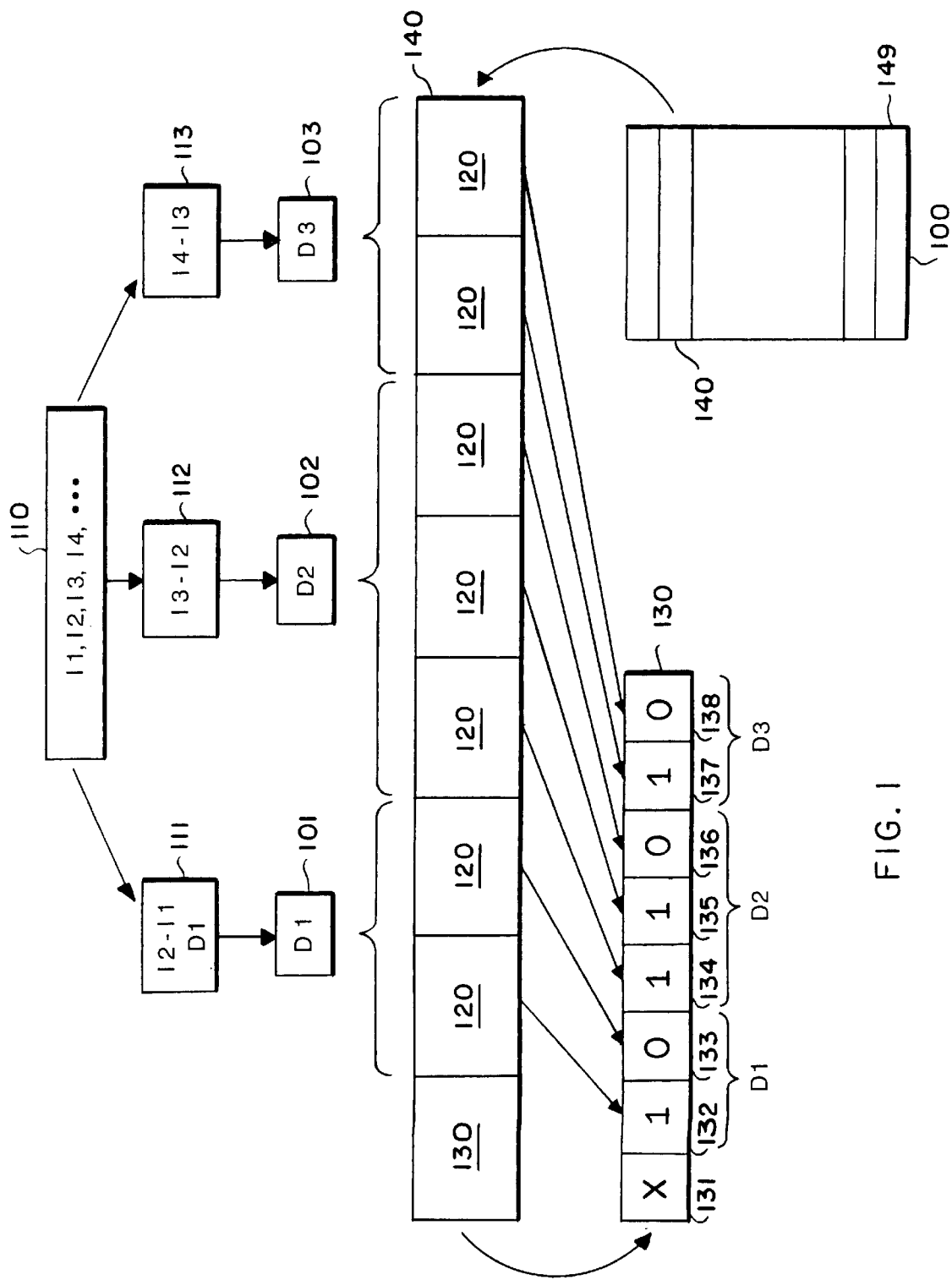
FIG. 1 is a block diagram of a list of delta values encoding an ordered sequence of integers as groups of bytes according to the preferred embodiment of the invention.

FIG. 1 shows a first data structure 100 of the preferred embodiment. The data structure is formed of a list of bit units referred to as logical quad-word units 140. The term "logical+ is used since the bit units can span physical memory boundaries as described in further detail below. In the preferred embodiment, one quad-word contains 64-bit units, or four 16-bit memory words, hence, quad-words.

In this description of the invention, the bits of each quad-word unit follow the little-endian convention, that is, low-order bits are shown on the left, and high order bits on the right. It should be apparent that big-endian convention can also be used. It should also be noted that bit units of other sizes can just as well be used. The size of the bit units is chosen so that for a particular processor architecture, the units can conveniently be loaded from a memory into processor registers by a single machine instruction.

As shown in FIG. 1, the values 110, e.g., I1, I2, I3, I4, . . . , etc., are an ordered sequence of integers 110. Delta values 101–103, e.g., D1, D2, and D3, are computed by taken the difference 111–113 between a current integer and a previous integer in the sequence 110, for example, D1=I2− I1. The first delta value is actually the very first integer encoded. The end of an ordered sequence is denoted by a delta value of zero which cannot otherwise occur in the list.

In a general sense the delta values will be the list of "integers" to be decoded and encoded, but as stated above the way the list is obtained and the underlying meaning of the integers in the list is not important. What is important, that the list of integers to be encoded are of variable sizes.

The present invention partitions the binary form of each delta value D1, D2, and so forth, into groups of eight bits, i.e., bytes 120, padding up to a multiple of eight bits when necessary. The number bytes required depends on the size of the delta value. If the integers in the sequence are relatively close together, then most delta values are expressed by groups of two bytes. Only occasionally are one byte or more than two bytes required. In the example shown, D1, D2, and D3 respectively require 2, 3, and 2 bytes. In any case, a minimal number of bytes are used to represent a particular delta value (i.e., an integer to be encoded).

An additional continuation bit is associated with each delta value byte as in the prior art. The bit is set to one when the next byte stores part of a delta value, and the continuation bit is set to zero if the byte is the last byte of a delta value. However, here the continuation bits for a fixed number of bytes, for example, seven, are collected in a single byte 130 as a continuation bit map. The bit maps 130 are spaced at regular intervals between delta value bytes 120. In other words, each logical quad-word unit 140 begins with a continuation bit map 130 followed by seven delta value (integer) bytes 120.

As shown in FIG. 1, the bit map 130 includes bits 132–138. The remaining first bit 131 is marked by (X). This termination bit is set to one for the last quad-word unit 149 of the list 100, that is, the quad-word which includes a zero delta value. For all other quad-words 140 of the list, the termination bit 131 is set to a zero. Although the use of the termination bit 131 is not essential to work the invention, it makes the test for the end of the list 100 faster.

It should be noted that a group of bytes for a delta value (variable size integer) can span multiple logical quad word units. For example, if the delta value D3 were to require four bytes, then the fourth byte of the delta value would be stored in the next quad-word. In most practical applications, a delta value is unlikely to be large enough to span more than two quad-word units.

The order of the continuation bits in the bitmap 130 of each quad-word unit 140 is not important, however, if the termination bit 131 is the low-order bit, then bit "i" of the bit map is the continuation bit for the ith byte of the quad-word unit 140. Similarly, the bit map within the quad-word does not need to be the first byte, it could also be some other byte of the quad-word. However, memory storage is reduced when it is the first byte in the case where the list 100 ends in the middle of a quad-word. In any case, the bit maps 130 are spaced at regular intervals among the bytes 120 so that one bit map is always loaded whenever a logical unit is accessed by a memory reference instruction. On a processor that uses the big-endian convention, the ordering of the bytes in the quad-word units 140 might change.

The most obvious way to read the encoded variable size integers as described above is to read the bit map 130 containing the continuation bits for the next seven bytes. Then, a case-statement can be performed on the value of the byte. A case-statement is sometimes also known as a "switch-statement," or a "computed-goto." For example, 256 procedures can be written, one procedure to decode the following bytes according to each of the 256 possible patterns of the bits in the bit map 130.

The case-statement passes the execution flow to one of 256 ($2^8$) different locations in a program. The instructions at the location associated with value the bitmap's value would use the following bytes to recover the delta values without any need to use conditional branch instructions, and consequently, no mispredictions.

The obvious way may seem optimum. However, in reality this is not the case because the jump instruction used during the execution of the case-statement is predicted in the same way as a conditional branch. Thus, misprediction suffers the same penalty. Because there are many possible predictions, the prediction for any jump will almost always be wrong, leading to one mispredict for every quad-word unit.

This is only slightly better than the prior art approach were there was one mispredict per three 2-byte delta values, rather than one every 3.5 two-byte values, as here. Worse, the amount of code in the decoding program has been increased because now there must be one procedure for each possible value of the bit map 130. This is bad. More procedures increase the number of instruction cache misses that the program will suffer as it is executed. Only when successive quad-words have the same bit pattern in the bit map byte 130 will the fetch unit of the processor pipeline hit in the instruction cache. It is unlikely that this will occur frequently.

Figure 2:
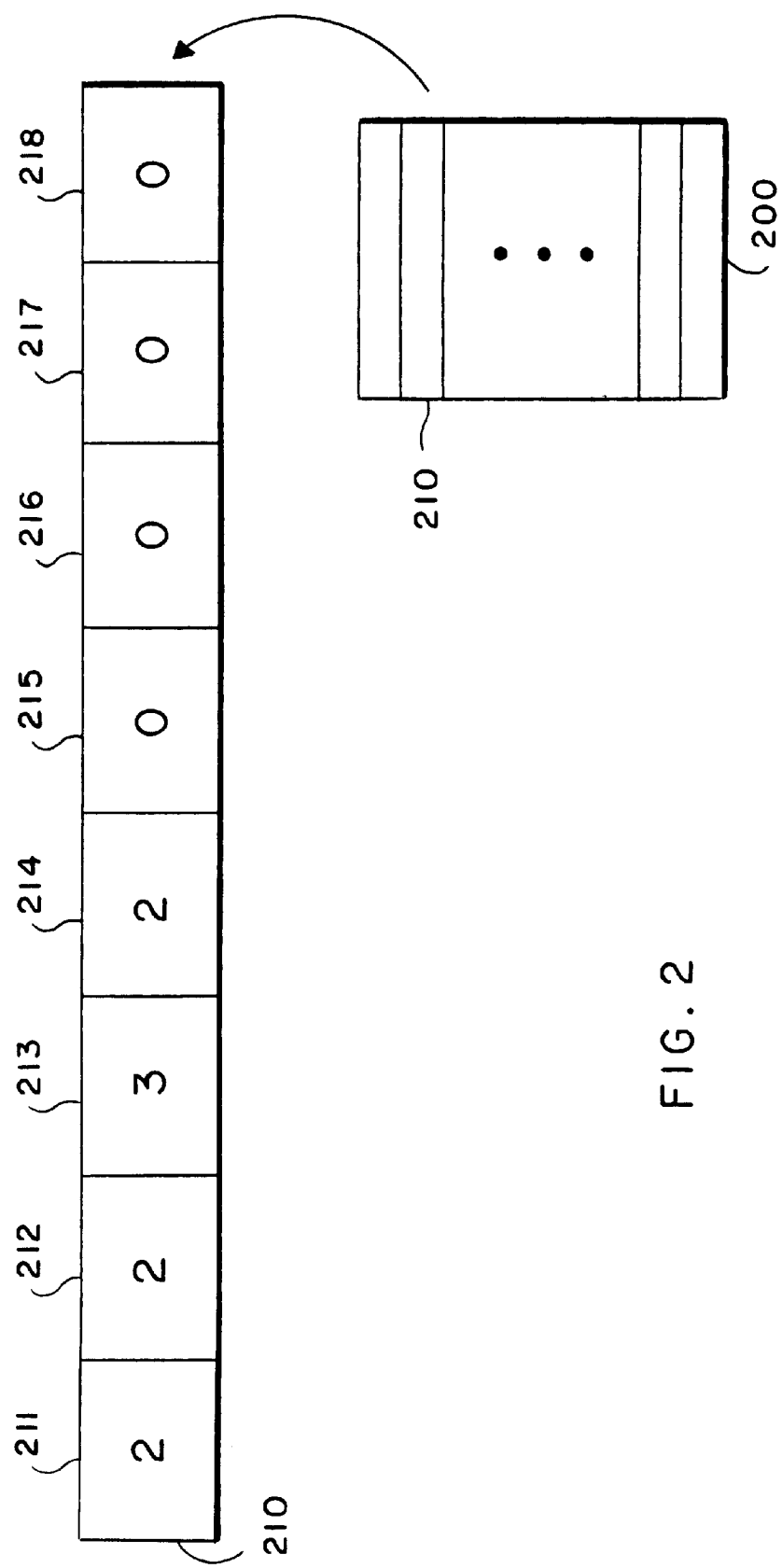
FIG. 2 is a block diagram of a array possible storing lengths of the groups of bytes.

As shown in FIG. 2, a better way to perform decoding is not to use the case-statement, instead a second data structure 200 is used in conjunction with the first data structure 100. In general, a decoding routine reads quad-words 140 from the list 100. The bit map 130 for each quad-word unit 140 is used as an index into the structure 200 to read corresponding array entries 210. The array entries are used by the decoder to recover integers from the delta values with a minimal number of branch mispredicts.

Although the bit map 130 can indicate 256 different index values, the array data structure 200 can be constructed with only 64 entries 210 because the bit map 130 used as an index includes only six "interesting" bits." One of the bits in the bit map 130 merely indicates whether the quad-word unit contains the end of the list; this termination bit can be tested separately. Also, is the continuation bit 138 for the last byte in the quad-word indicates whether the variable size integer continues into the next quad-word. This bit is best handled while processing the next quad-word. Therefore in an optimal implementation, the array 200 has only 64 entries.

Each entry 210 in the array 200 is partitioned into eight 3-bit fields 211–218. Each 3-bit field gives the number of bytes in a group of bytes that were formed for a delta value or arbitrary variable size integer. Only three bits are needed because each quad-word has at most seven data bytes, not counting the bit map byte, and seven can be represented in three bits.

The first 3-bit field 211 is used in a special way that will be described in greater detail below. The rest of the 3-bit fields 212–218 store the number of bytes for the delta values of the quad-word, for example, 2, 3, and 2, or parts when a delta value extends into the next quad-word. The values 2-3-2 correspond to a continuation bit pattern of "10-110-10." Because the last continuation bit isn't used for the lookup in the table, the pattern "10-110-11" also leads to the field values 2-3-2—the final field is in this case only the first two bytes of a delta that continues into the subsequent quadword. Note, in this example, the last four 3-bit fields 215–218 are not used and are each set to zero. Only in the rare case when a quad-word stores seven delta values will all 3-bit fields be used, then each 3-bit field stores a value of one corresponding to a bit map pattern of "0 0 0 0 0 0 0"—the continuation bits "0 0 0 0 0 0 1" also generate seven deltas in one quadword for the same reason as above.

Returning to the first 3-bit field 211. This field stores a copy of the value in the last non-zero 3-bit field, e.g., field 214. That is, the field contains a duplicate of the length of the last delta value, or partial variable size integer in the quad-word, in this example, 2. The first 3-bit field 211 is redundant, but speeds decoding in a manner described below.

Figure 3:
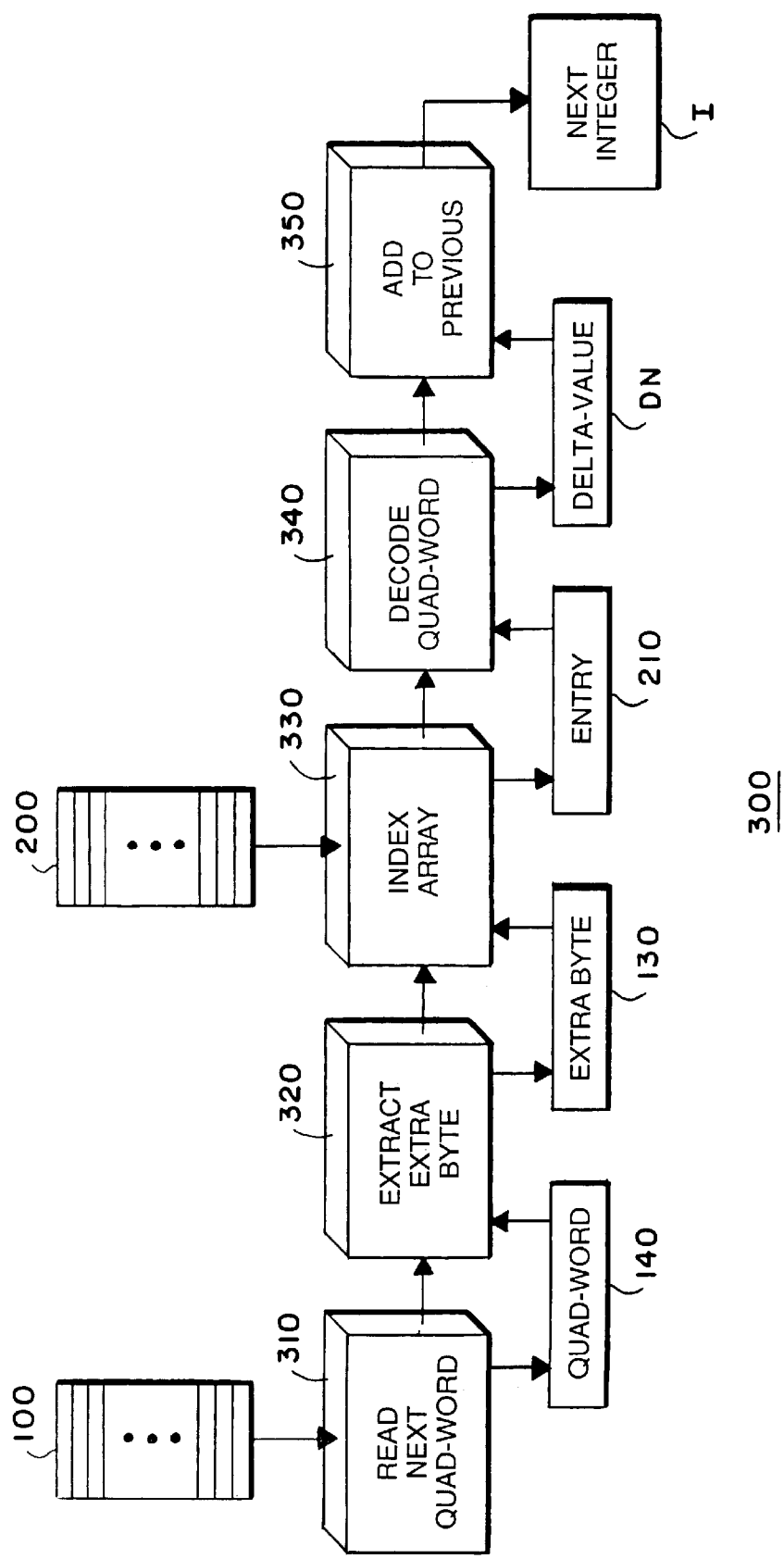
FIG. 3 is a flow diagram of a procedure for decoding the list of FIG. 1 using the array of FIG. 2.

As shown in FIG. 3, the sequence of ordered integers can be recovered by a procedure 300 with minimal mispredicts using, the first and second data structures 100 and 200. In step 310 of procedure 300, the list 100 of quad-words 100 is sequentially read to read a next quad-word Q 140. In the preferred embodiment, the next quad-word 140 is read well in advance before it is used to hide any memory latencies that might be incurred when the word is stored in a higher level of memory, and not in a data cache immediately adjacent to the processor.

In step 320, the bit map 130 is extracted. The middle six bits of the bit map are used in step 330 as an index I to read one of the 64 entries in the array 200. The bit fields of the entry 210 are used to decode the following bytes of the quad-word 140 to obtain the next delta value (DN) in step 340. Step 350 adds the delta value to a previously decode integer to obtain the next integer. If the variable size integers are something else than delta values, step 350 may perform some different type of operation, such as a compare.

On the Alpha processor, the decoding can be done in six instructions, including the addition needed to undo the delta value encoding, and a test for whether the correct place in the list 100 has been found. On processors using other architectures, or where the variable size integers represent something else, such as characters, additional or other instructions may be needed.

Figure 4:
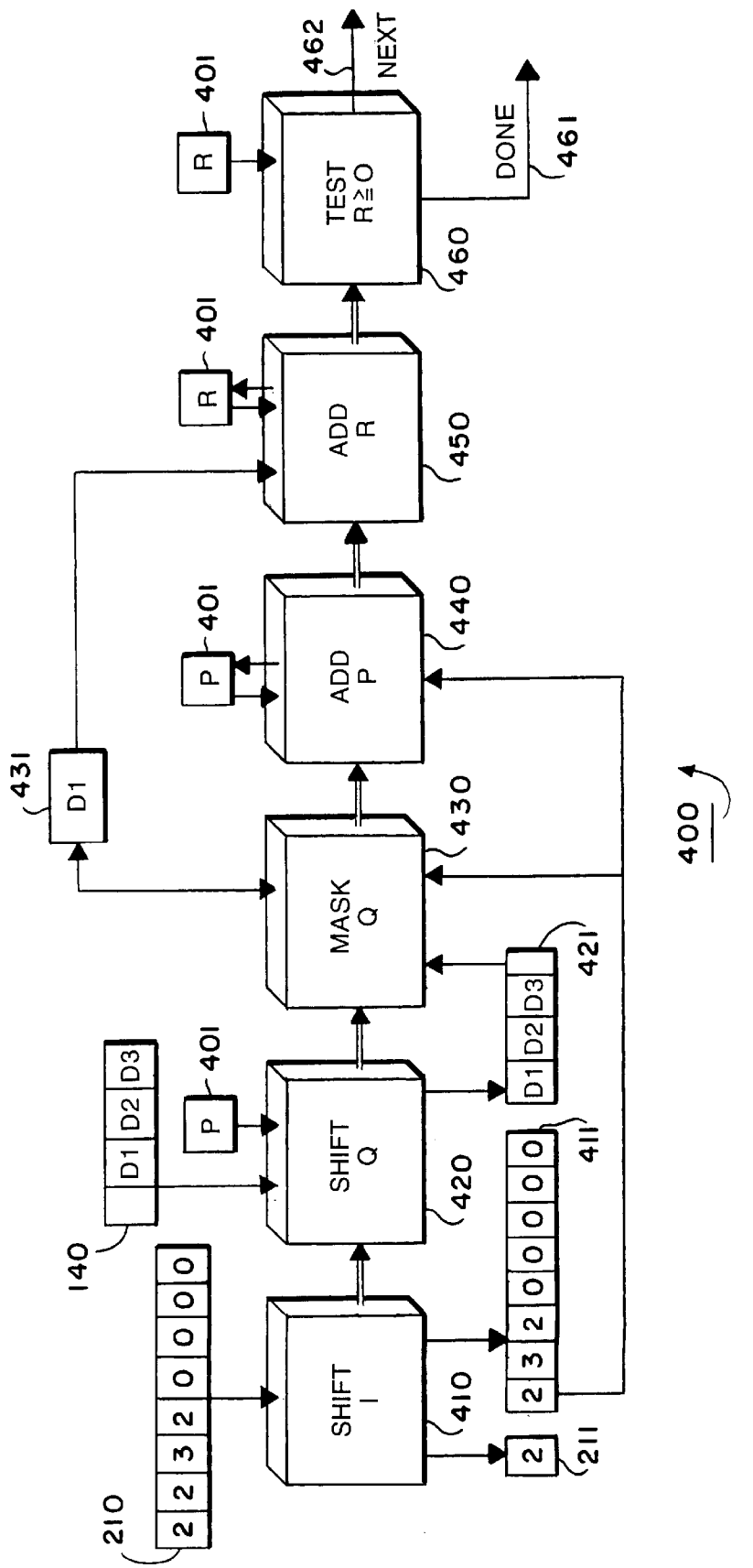
FIG. 4 is a flow diagram of six basic instruction steps used by the procedure of FIG. 3.

FIG. 4 shows the six basic steps 400 that form the gist of how to decode the delta values in a quad-word, steps 340 and 350. A processor register Q holds the next quad-word 140 from the list 100 to be decoded. A register I stores the entry 210 retrieved from array 200 according to the index bits in the bit map 130 of the quad-word 140. A processor register P 401 is initialized to the value 1. A processor register R 402 stores the current running total, i.e., the previously decoded integer. The running total is expressed as an offset, so the goal is to locate a delta value that will make the running total in R 402 at least zero. In FIG. 4, each step can be executed by one instruction in the Alpha processor, in other words six instructions are required to decode a group of delta value bytes.

In step 410, the value 210 in register I is shifted three bit positions to remove the duplicate 3-bit field 211. These three bits, which indicate the number of bytes of the last delta value, are used in the case that the last delta value carries over into the next quad-word. The result in register I after shifting is the value 411. The duplicate field bits 211 can be stored in a temporary processor register T.

In step 420, the quad-word 140 in register Q is byte-shifted by the amount stored in processor register P 401. Initially, register P stores one, so the quad-word is shifted one byte to place the bytes of the delta value D1 in the low order bytes of register Q. e.g., the value 421. The first shift removes the bit map 130.

In step 430, the low order 3-bit field of the value 411 in register I, e.g., are used to mask the shifted quad-word 412 in register Q. This leaves the first delta value D1 431 of the quad-word in register Q.

In step 440, the low order 3-bit field of 411 is added to register P 401, so now register P points at the first byte position of the next delta value D1.

In step 450, the delta value D1 431 is added to the running total in register 402.

In step 460, register R 402 is tested by a conditional branch instruction to determine when the stored value is at least zero, i.e., R≧0. If so, then the desired integer has been found, and decoding is done, and the branch 461 is taken, otherwise, the branch is not taken 462 and the execution flow falls through linearly to decode the next delta value by repeating these six basic steps as described below. The values in registers I and P are advanced to be correct for the next delta value by steps 410 and 430.

One might wonder how the basic steps 400 avoid branch mispredicts. Notice first of all, there is no conditional branch instruction to test whether a quad-word has completely been decoded. There is only one conditional branch instruction on the running total in register R. The branch 461 is only taken when the entire procedure 300 completes. Because the procedure 300 may decode thousands or millions of delta values before the desired integer is located, the fraction of branch mispredicts introduced by the branch 461 is negligible. In a practical application, the execution flow mostly proceeds linearly along path 462.

One might also wonder why a look-up in the array 200 is preferable to a case statement. This is true because the array look-up can be prefetched. That is, the instruction which performs the array look-up in memory can be advanced in the instruction sequence to hide any memory latencies, as stated above.

However, to detect the end of the quad-word, it is necessary to determine whether the value 411 in processor register I is zero. However, this test can introduce branch mispredicts should it be used after decoding every delta value. The key point about the sequence 400 of six steps, even when the six steps are executed more times than necessary, is that the time required for unnecessarily executing these six instructions, compared with the dine delay suffered for handling a branch mispredict, is negligible. When the last delta value in a quad-word has been processed, register I will absolutely be zero.

Shifting register I by 3 bits in step 410, each time the six instructions are repeated, eventually yields zero. So the step 410 in essence becomes a null operation (NOP). The second step 420 will yield some value 412. Masking a quad-word at position zero in step 430 always yields zero. Also, step 440 will add zero, so this step also becomes a NOP. And, step 450 will merely add zero to the running total, so the test in step 460 also has no adverse effect.

Figure 5:
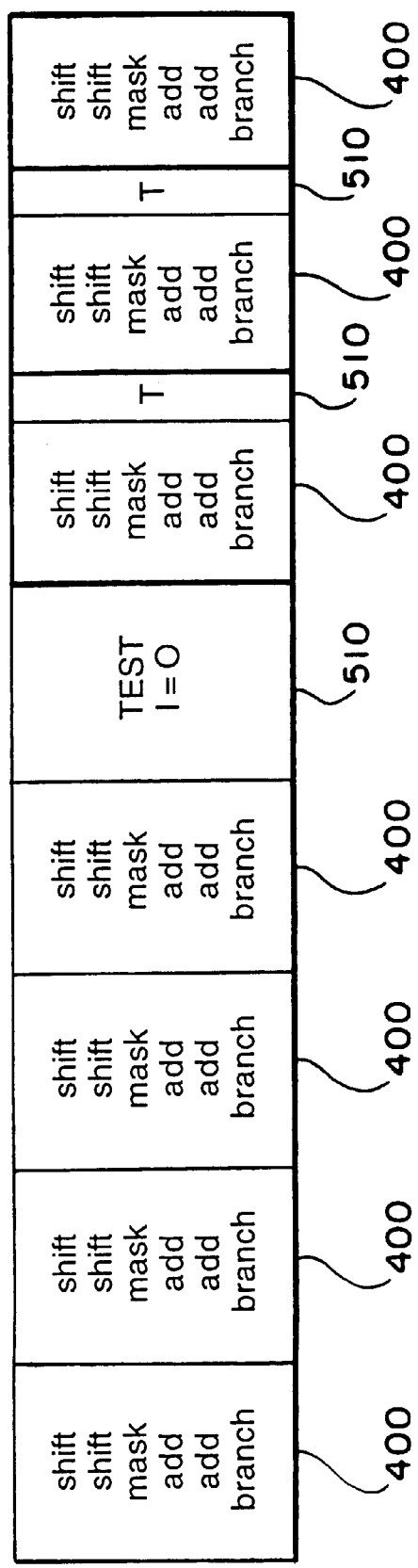
FIG. 5 is a block diagram of seven copies of the six basic instruction steps arranged to decode multiple groups of delta values.

As shown in FIG. 5, a linear execution of the steps 400 is achieved by having four instances of the set of instructions 400 with no test for the end of a quad-word at the end of each of the first three instances. Four instances are chosen because most delta values consume two bytes. In this case, on the average, a quad-word stores 3.5 delta values, the last delta value carrying over into the next quad-word. It should be noted, the number of instances can be adjusted for other average size integer values, and other quad-word sizes. If the quad-word contains fewer than four variable size integer values, then some instances of the sets of instructions 400 are unnecessarily executed, but not very many, because on the average it is unlikely that a quad-word will contain fewer than four variable size integers.

The first four instances are followed by three additional instances. The last three instances of the basic six instruction sequence 400 deal with the rare cases where a quad-word stores more than four delta values. Each of these instances is preceded by a conditional branch 510. The branch 510 tests whether register I stores zero. Now, the first branch 510 will almost always be predicted as taken, because the quad-word will very rarely contain more than four variable size integer values. Note, the last instance does not require a test because all bytes are guaranteed to be consumed by the time the seventh instance of the basic set has been executed. Thus the present invention eliminates time consuming branch mispredicts.

The above described procedure can also be used with processors that do not have instructions that mask and extract bytes from words. However, the procedure can be implemented with some small number of additional instructions. For example, on a processor which performs only bit-wise shifts, one would maintain registers P and I shifted by 3 bits to the left. This can be done by adding a single "AND" instruction after each shift of the value in register I. Then the extract becomes a single bitwise shift, while the mask becomes a bitwise shift of a constant followed by an "and not." also known as "bit-clear" instruction. This would make the steps 400 require eight instead of six instructions. Adding two instructions to the steps 400 is a small penalty to pay for a substantial reduction in branch mispredicts. Even with the two additional instructions, the time required for variable size integer decoding is greatly reduced.

It is still necessary to deal with the case where a particular variable size integer (delta value in this example) carries over into the next quad-word. This is handled by the addition of extra instructions to the first set of basic six instructions, but not to any other copies of these instructions. The extra instructions use the initial duplicate 3-bit field 211 stored in the temporary register T. Recall, the duplicate field 211 is the number of bytes of the last delta value in the quad-word 210.

Therefore, the value in register T is set to zero when the last bit 138 of the extra byte 130 of the quad-word 140 is zero because zero that indicates that the delta value does not span two quad-words. Then, the first integer value of the next quad-word is shifted by the number of bytes indicated in the duplicate 3-bit field 210.

In a "quad-issue" machine, that is a processor which can concurrently execute four instructions, 6 instructions can issue in 1.5 clock cycles, particularly when the instructions use different functional execution units, for example, adders, shifters, and branchers. Therefore, four copies of the six instructions will execute, on the average, in 6 cycles, although as explained above, some of those six cycles will effectively do no useful work. In a four-wide, wide, five stage processor pipeline, a single mispredict may waste twenty or more clock cycles, so having duplicate copies is a small price to pay for increased throughput. In addition, on the average, the test 510 after the fourth copy will mostly be predicted correctly, so additional delta values can be decoded without the loss of any cycles.

As processor pipelines increase in length and width in next generation computers, encoding and decoding using data structures having static states, instead of relying on dynamic instruction flows, which can mispredict, will increasingly become more important in order to process extremely long data stream, e.g., streams with hundreds of millions of bytes.

Figure 6:
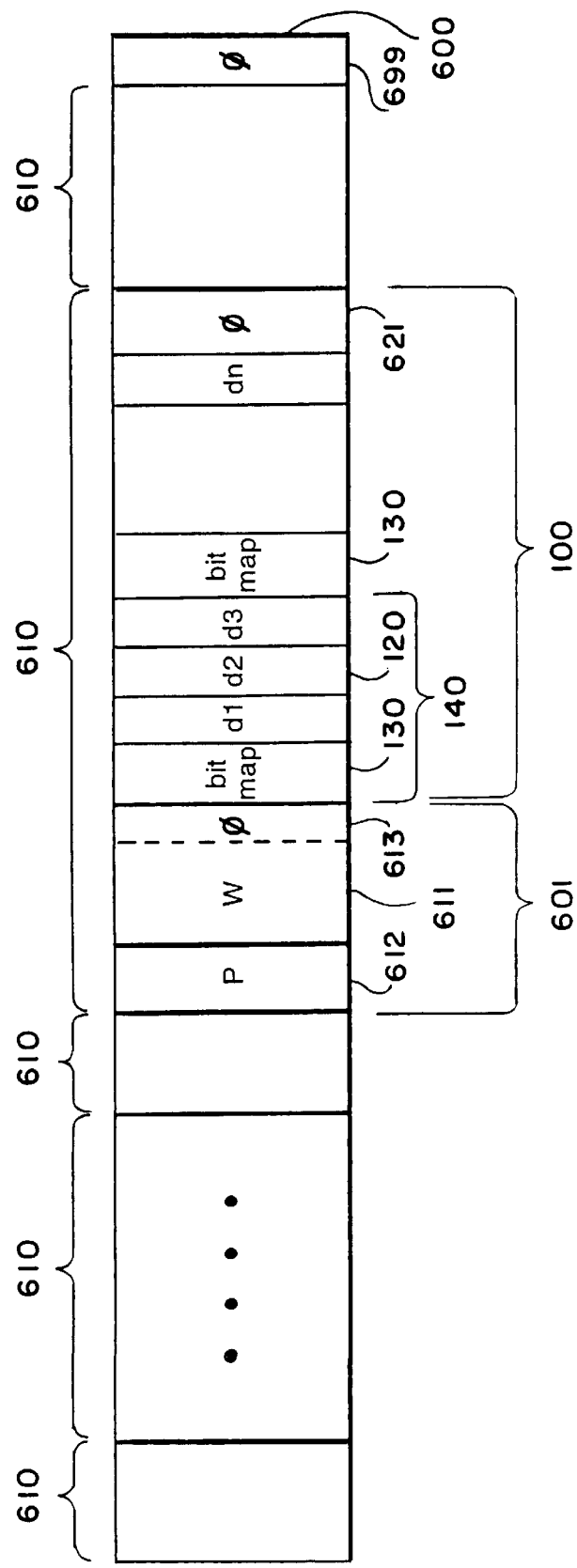
FIG. 6 is a block diagram of file format storing a plurality of word entries, each word entry followed by a list of associated delta values.

One such encoded data stream or file 600 is shown in FIG. 6 for the above described search engine application. The file 600 forms the foundation for an index of Web pages. The file 600 stores a plurality of entries 610. Each entry 610 identifies a unique Web token or "word" 601 followed by the list 100 of locations where the word 601 can be found in the Web pages. Each entry 610 is encoded as follows.

The encoding process produces a word entry 601 includes a prefix count 612 and a unique Web page word 611. The prefix count 612 indicates how many bytes of the word 611 are in common with a previously encoded word. The prefix count 612 is increased by one so that the prefix 612 can never have any value other than zero. In other words, the prefix 612 cannot encode values greater than 254. This is not a problem because human recognizable words do not exceed this count. The prefix counts can be stored using the delta value encoding according to the invention.

The prefix count 612 is followed by the individual characters of the word 611 that are different from the previously indexed word. The word entries 610 are ordered according to any preferred collating order, for example, in a lexicographic alpha-numeric ordering. The non-common characters of the word 611 are terminated by either one or two zero bytes 613 for reasons stated below.

The zero byte 613 is immediately followed by the first byte of the list 100 of delta values. In other words, the bytes of the file 600 are tightly packed and do not necessarily align with physical memory boundaries. The delta values of the addresses or location of the words (the ordered sequence of integers, i.e., d1, d2, d3, ... , dn), are stored in a minimum number of bytes 120. The delta value bytes 120 are partitioned into groups of, for example, seven bytes. Each group of seven delta value bytes is associated with a bit map byte 130 to form eight byte logical quad-word units 140 as described above.

The bit maps 130 are placed at regular intervals between the groups of bytes 120 so a bit map is always loaded during a memory reference instruction. Preferably, the bit map 130 is the first byte of the quad-word unit 140. There is one continuation bit in the bit map 130 for every delta value byte of the associated group. A continuation bit is set to one if the corresponding delta value byte is followed by another byte, otherwise, the continuation bit of the last byte of a delta value is set to zero. The termination bit 131 of the bit map 130 is set to one if the list 610 of delta values terminates in the quad-word, otherwise, the low order bit 131 is set to a zero. Termination is also indicated by a last delta value of zero 621, which cannot otherwise occur. Having a second termination indication in an otherwise used bit of the bit map speeds up processing.

In the case where a previous word entry 601 terminates in the middle of a physical quad-word unit, the bit map may be another than the first byte of a physical quad-word, except, that is, for the last byte. To achieve this desired result, an extra null byte 613 is added as a terminator of the word 611 whenever the terminating null byte 613 occurs in the sixth byte of a physical quad-word. Then, the bit map 130 can never be the last byte of a physical quad-word unit.

The reason this is done is because it is desired to prefetch a bit map and at least one associated delta value with a single memory reference instruction, for example, a "load" instructions. If the bit map is allowed to fall in the last byte of a physical quad-word unit, then the associated delta value bytes would not be fetched until the next load instruction. This may introduce delays due to memory latencies.

As stated above, the delta values d1 ... , dn, and bit maps are then packed as eight bit groups or logical quad-word units 140 according to the little-endian convention using as few complete bytes for each delta value as possible. Delta values are allowed to carry over into a next logical word unit where necessary.

In the case of indexing Web pages, each list 100 may include thousands, if not millions of delta values for many Web page tokes. Packing the bytes of the list 100 substantially reduces memory storage while still allowing a reduction in the number of mispredicts. The file 600 terminates with a zero byte 699 which could not otherwise occur as a prefix count 612.

In the case where the bytes of a particular delta value straddle two logical quad-word units, the high order continuation bit of its bit map 130 will be set to one to indicate there are additional delta value bytes of the group in the next quad-word.

During decoding of the file 600, the number of bytes used to minimally expressed each delta value is determined by a look-up in the table 200 using the associated bit map 130, rather than computing the size using case statements. The sizes of the delta values are expressed as 3-bit fields 211–218 zero filled as necessary with the first 3-bit field being a duplicate of the last non-zero field. The bit maps are needed for the table look-up are spaced at regular intervals in the portions of the byte stream 600 that comprises the lists 100. This allows the decoding procedure 300 of FIG. 3 to prefetch the next table entry 210 before a previous delta value has been decoded.

The processing of a integers using unknown a priori lengths as determined by a table look-up, and instructions which have no impact on the processors's state when the length is zero, will take less time than correcting a branch mispredict. Thus, the decoding procedure can almost always avoid expensive to process branch mispredicts.

It is understood that the above-described embodiments are simply illustrative of the principles of the invention. Various other modifications and chances may be made by those skilled in the art which will embody the principles of the invention and fall within the spirit and scope thereof as set out in the claims attached.

I claim:

1. A computer implemented method for encoding a list of variable size integers, comprising the steps of:

expressing each variable size integer as a set of bytes;

grouping a fixed number of the bytes of the sets with an associated bit map into a logical memory word unit, each bit map having one continuation bit for each of the fixed number of bytes, each continuation bit indicating whether or not a particular variable size integer continues into a following byte;

storing an entry in an array for each possible pattern of continuation bits of the bit maps, each entry including a plurality of fields, there being one field for each of the fixed number of bytes in each group, each field storing a length of a corresponding set of bytes expressing a particular variable size integer in the group to provide a decoding table indexable by the bit maps to recover the list of variable size integers.

2. The method of claim 1 wherein the set of bytes is the minimum number of bytes required to express a particular variable size integer.

3. The method of claim 1 wherein the fixed number of bytes is seven to form eight byte logical memory word units.

4. The method of claim 1 wherein each bit map includes a termination bit, and setting the termination bit to a one when the logical memory word unit stores a last variable size integer, and setting the termination bit to zero otherwise.

5. The method of claim 1 wherein the length a particular field is set to zero if there is no corresponding set of bytes expressing a particular variable size integer in the logical memory word unit.

6. The method of claim 5 wherein a first field of each entry stores a duplicate copy of the last non-zero length field of the entry.

7. The method of claim 6 further including the steps sequentially loading the logical memory word units into a first register, indexing the array according to the bit map of each loaded logical memory word unit to load a corresponding entry into a second register, and storing a one into a third register, and for each loaded logical memory word unit further comprising the basic steps of:

shifting the fields of the second register one field position to place the length of the corresponding set of bytes in the low-order field position of the second register;

shifting the bytes of the first register according to value stored in the third register;

masking the first register according to the length of the low-order field position of the second register to extract the set of bytes of a next variable size integer;

adding the length of the low-order field position of the second register to the third register;

testing the variable size integer with the result value to determine if the next variable size integer is a desired variable size integer.

8. The method of claim 7 further comprising the step of terminating when the next variable size integer causes the sum of all variable size integers considered to exceed a predetermined value, and otherwise repeating the basic steps a first predetermined number of times in a linear execution flow to decode the list of variable size integers of the logical memory word unit.

9. The method of claim 8 further comprising the steps of repeating the basic steps a second predetermined number of times, each repeat followed by a test to determine whether all variable size integers of the logical memory unit have been decoded, the first and second predetermined number being equal to the fixed number of bytes to reduce branch mispredicts.

10. The method of claim 1 wherein the list of variable size integers are delta values associated with Web pages indexed by a search engine.

11. The method of claim 1 wherein the list of variable size integers encode multiple character sets.

\* \* \* \* \*